United States Patent [19]
Bower

[11] 4,074,178
[45] Feb. 14, 1978

[54] TIME LIMITED DIGITAL OSCILLATOR

[75] Inventor: Gerald Shelton Bower, Paso Robles, Calif.

[73] Assignee: Systron-Donner Corporation, Concord, Calif.

[21] Appl. No.: 644,758

[22] Filed: Dec. 29, 1975

[51] Int. Cl.$^2$ .............................................. G05B 11/01
[52] U.S. Cl. .................................................. 318/631
[58] Field of Search ................... 318/631; 331/108 D, 331/111, 113 R, 173

[56] References Cited
U.S. PATENT DOCUMENTS

| 3,562,558 | 2/1971 | Totten | 331/111 |
| 3,797,320 | 3/1974 | Clampitt | 318/631 |

OTHER PUBLICATIONS

Dean et al. "RCA Application Note ICAN 6267 Digital Integrated Circuits", Mar. 1971, pp. 353–360.

Primary Examiner—Robert K. Schaefer
Assistant Examiner—Eugene S. Indyk
Attorney, Agent, or Firm—Flehr, Hohbach, Test, Albritton & Herbert

[57] ABSTRACT

A circuit for providing an oscillatory driving signal from the point in time when power is supplied to a predetermined point in time thereafter. A force balance transducer having a pick-off device with a stationary member and a moving member mechanically mounted for movement relative to the stationary member is disposed to sense a predetermined physical quantity and to produce an output relative thereto. A force producing device is coupled to the moving member for receiving the output and for driving the moving member to a predetermined neutral position. The transducer is actuated by a source of electrical power and contains a gating circuit, an astable multi-vibrator and a coupling circuit. The gating circuit is actuated by initial application of the electrical power to the transducer and actuates the astable multivibrator for a predetermined period of time. The coupling circuit couples the output from the astable multi-vibrator to the force producing device for initially driving the moving member to remove static friction and thereby remove initial erros due to static friction in the pick-off device within the predetermined time period after initial application of power.

10 Claims, 5 Drawing Figures

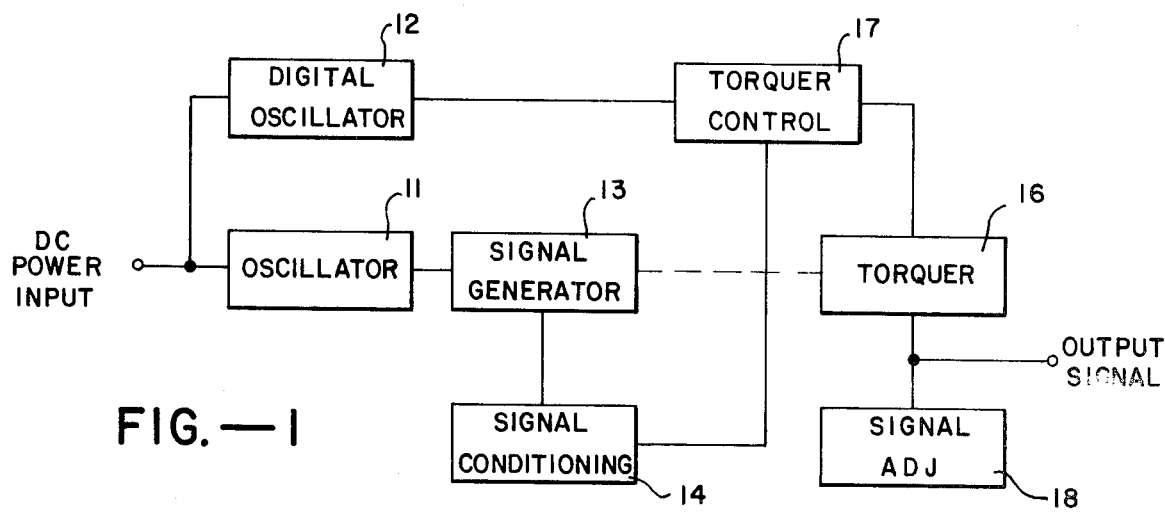
FIG.—1
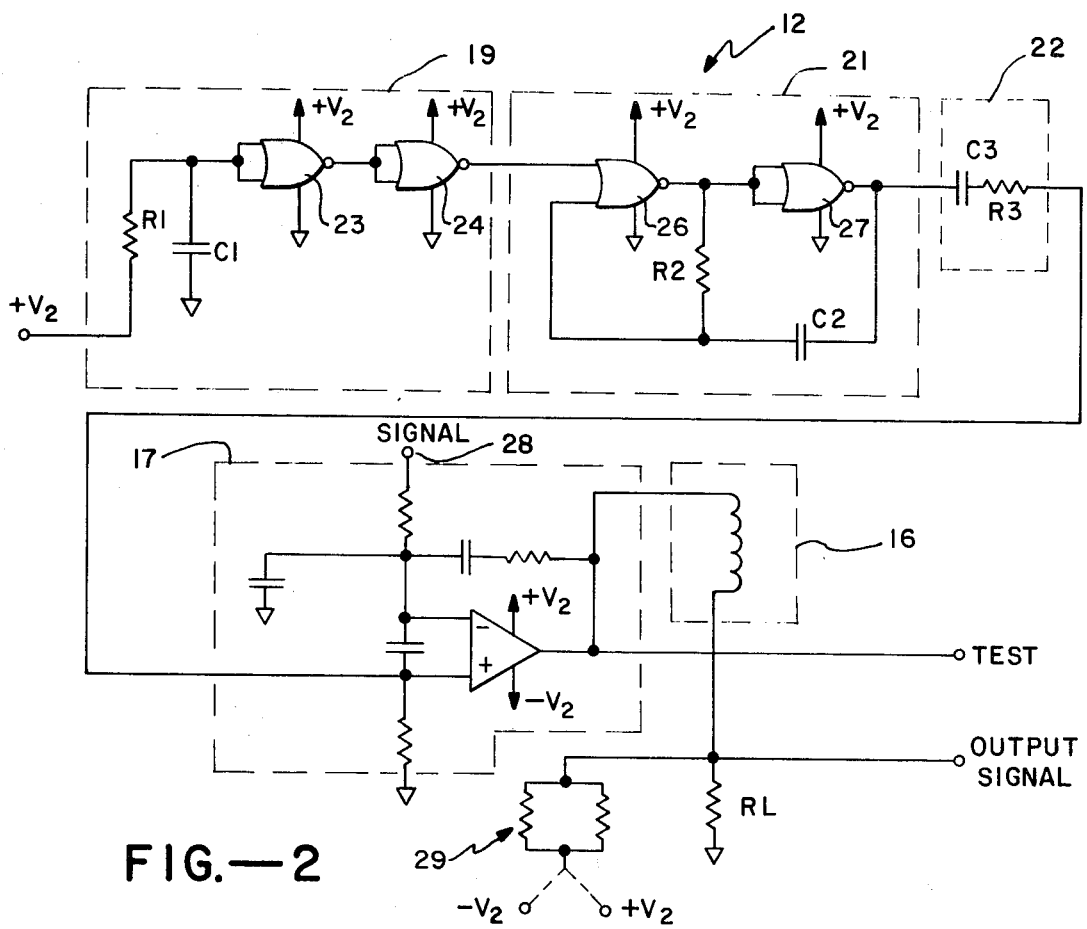
FIG.—2
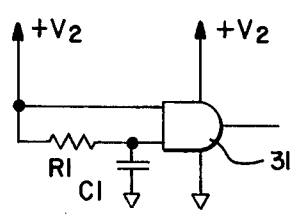
FIG.—3
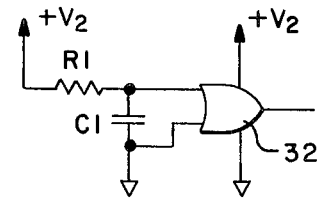
FIG.—4

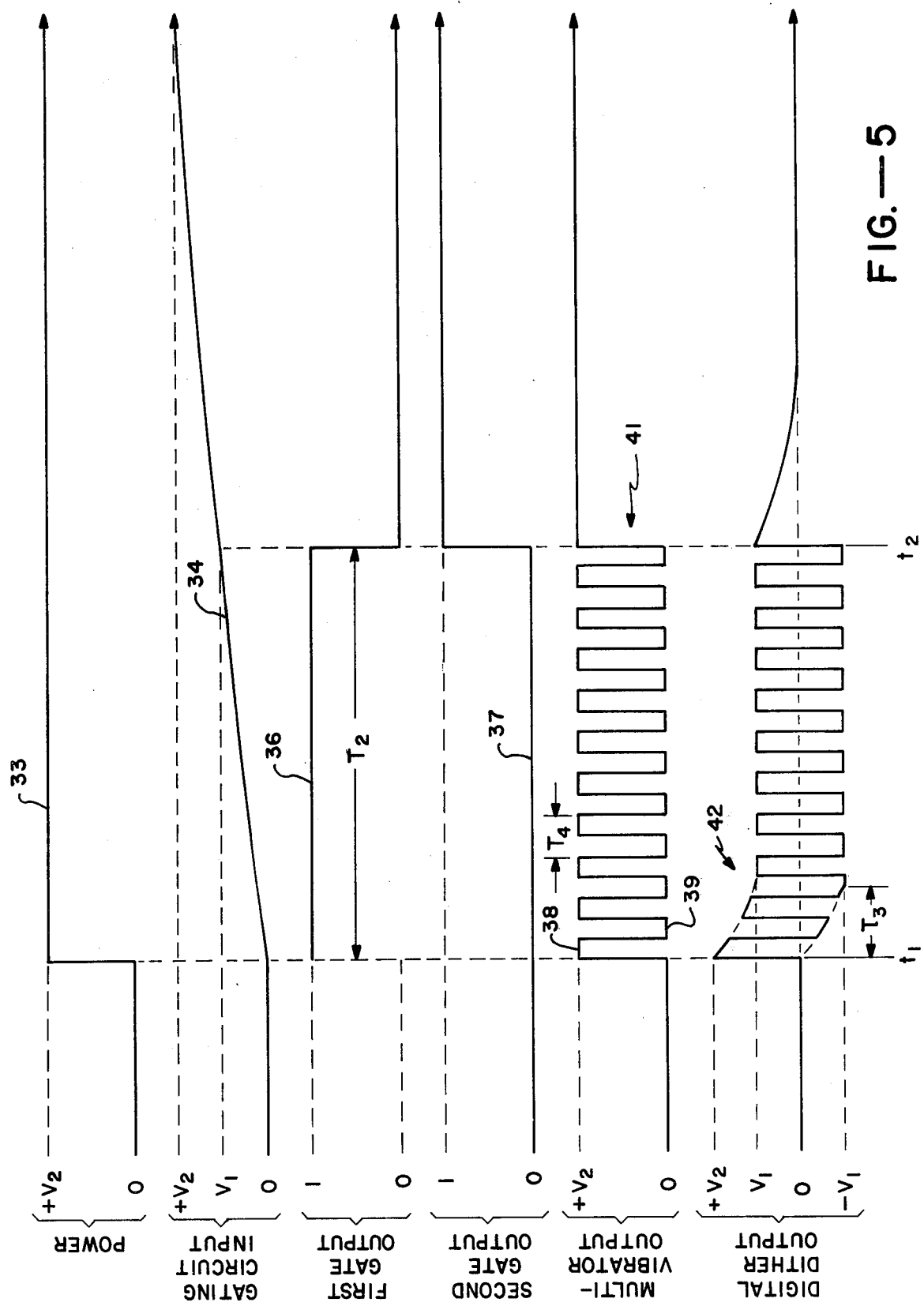
FIG.—5

TIME LIMITED DIGITAL OSCILLATOR

BACKGROUND OF THE INVENTION

This invention relates to an oscillatory driving circuit and more particularly to a circuit for providing oscillatory drive signals for a mechanically mounted member to remove initial static friction therefrom.

Initial or static friction has long been a problem in the field of precision transducers for sensing physical quantities such as displacement, velocity, and acceleration due to the initial errors induced by static friction in the instrument assembly. Various schemes for overcoming the static friction errors have been introduced, including mechanical buzzers, destabilization of feedback, or application of oscillatory inputs at the initial power application by circuitry which is hard wired into the remainder of the transducer circuitry. The latter circuitry requires continuous power drain which is often times unacceptable. The mechanical buzzer generally requires relatively high power levels as well as presenting a reliability problem which is a function of the environment to which the transducer is exposed. Feedback loop destabilization presents the possibility of an additional failure mode in nonoperation or in continuing operation of the destabilizaton and is therefore objectionable for some applications. A means for providing driving signals for a short period of time after application of power is needed which requires minimal power drain subsequent to the short period of time, which presents no reliability problem from malfunction and which is insensitive to environmental change.

SUMMARY AND OBJECTS OF THE INVENTION

In general the digital oscillator disclosed herein is responsive to application of a DC power signal which excites an electrical device. A gating circuit is coupled to receive the DC power signal and provides an output signal which is responsive thereto. Means is coupled to the gating circuit for causing the gating circuit output to change states at the end of a predetermined period of time after application of the DC power signal. An astable multi-vibrator is connected to receive the output of the gating circuit. The astable multi-vibrator produces a series of signal pulses from the time at which the DC power signal is supplied until the end of the predetermined time period thereafter. The series of signal pulses are coupled to the electrical device for driving the device in an oscillatory manner during the predetermined time period so that static friction is removed and errors arising therefrom are eliminated.

It is an object of the present invention to provide a digital oscillator for driving a mechanically mounted member for a predetermined period of time.

Another object of the invention is to provide a digital oscillator which has the fewest number of electronic components therein.

Another object of the present invention is to provide a digital oscillator which utilizes minimal stand-by power.

Another object of the present invention is to provide a digital oscillator which utilizes a low power level when actuated.

Another object of the present invention is to provide a digital oscillator having minimal physical size.

Additional objects and features of the invention will appear from the following description in which the preferred embodiment has been set forth in detail in conjunction with the accompanying drawings.

BRIEF DESCRIPTION OF THE DRAWINGS

FIG. 1 is a block diagram showing one application of the present invention.

FIG. 2 is an electrical schematic diagram including the present invention.

FIG. 3 is an electrical schematic showing a variation for a use in FIG. 2.

FIG. 4 is an electrical schematic showing an additional variation for use in FIG. 2.

FIG. 5 is a time diagram of the signals occurring in the schematic diagram of FIG. 2.

DESCRIPTION OF THE PREFERRED EMBODIMENT

FIG. 1 depicts an application in which the digital oscillator disclosed herein may be utilized. A DC power input is shown connected to an oscillator 11 and a digital oscillator 12. Oscillator 11 supplies a signal generator 13, a signal conditioning circuit 14, and a torquer 16 through a torquer control circuit 17. Torquer 16 is connected to a signal adjust 18 from which an output signal is taken as shown. Digital oscillator 12 is also connected to torquer control 17 so that the output therefrom will drive torquer 16 as readily as the output from signal conditioning circuit 14.

Signal generator or pick-off 13 is of the type having a stationary member and a moving member mounted in mechanical mounts for motion relative to the stationary member. The relative motion between the stationary member and the moving member provides the output from pick-off 13.

FIG. 2 shows digital oscillator 12 in conjunction with torquer control 17 and torquer 16. A gating circuit 19 is shown connected to an astable multi-vibrator 21 which in turn is connected to an AC coupling circuit 22. AC coupling circuit 22 is shown connected to torquer control 17 which in turn is connected to torquer 16. The manner in which oscillator 11, signal generator 13, signal conditioning 14, torquer control 17, torquer 16 and signal adjust 18 function to provide the output signal is adequately described in U.S. Pat. No. 3,707,091.

Gating circuit 19 in FIG. 2 is shown as receiving power indicated as $+V_2$ through resistor R1 to a pair of inputs on NOR gate 23. Capacitor C1 is connected between the inputs to NOR gate 23 and ground potential. The output of NOR gate 23 is connected to two inputs of NOR gate 24 which provides an output to the astable multi-vibrator 21.

Astable multi-vibrator 21 is well known in the art and operates to provide a series of signal pulses at the output thereof when actuated by gating circuit 19. One type of astable multi-vibrator for use in the circuit disclosed herein may be found in RCA Solid State Division Digital Integrated Circuits Handbook, page 518, ICAN-6230. Astable multi-vibrator 21 produces a series of digital signal pulses which are connected to the input of AC coupling circuit 22. AC coupling circuit 22 operates to present the series of signal pulses to torquer control 17 at one input thereto. The transducer signal related to the physical quantity being measured is connected to torquer control 17 at another terminal 28. AC coupling circuit 22 isolates astable multi-vibrator 21 from torquer control circuit 17 for DC or low frequency signals while transmitting the series of signal pulses provided by astable multi-vibrator 21. In this fashion, torquer 16 is driven in an oscillatory manner for a predetermined period of time after power is applied to the transducer so that static friction is removed from the mechanical mounts of the moving member of signal generator 13.

FIG. 2 further shows a load resistor RL from which the output signal from the transducer is obtained. An output signal adjust network 29 is shown for obtaining given output levels for given displacements between the stationary and moving members in pick-off 13. These features are known in the art.

Gating circuit 19 is shown in FIG. 2 in a preferred form. The form of gating circuit 19 is largely dictated by the availability of circuit elements in integrated circuits utilized with the transducer. Another form for gating circuit 19 may be seen in FIG. 3 in which an AND gate 31 has connected to two inputs thereof the power signal $+V_2$ and a resistive capacitive network comprised of R1 and C1. It may be seen that the output from AND gate 31 will change state at a predetermined time after application of power, $+V_2$, dependent upon the charging characteristics of the circuit provided by R1 and C1. When C1 is charged to the transfer voltage of gate 31 the output thereof will switch from an electrical low to an electrical high state. The output of AND gate 31 may therefore be connected to terminate the series of digital pulses from astable multi-vibrator 21.

FIG. 4 is yet another form of gating circuit 19 utilizing an OR gate 32 with a resistive capacitive network comprised of R1 C1 as shown at the input. When power, $+V_2$, is applied both inputs of OR gate 32 are at a logical low state. As capacitor C1 charges through resistor R1, the signal on one input of OR gate 32 rises through the transfer voltage causing a change in state from a logical low to a logical high at the output of OR gate 32. The output of OR gate 32 may therefore be used to terminate the series of digital pulses produced by astable multi-vibrator 21 as described above. Gating circuit 19 may also be envisioned as a one shot signal device actuated by application of the power signal $+V_2$. Astable multi-vibrator 21 will produce a series of digital pulses from the time the power $+V_2$ is applied until the end of the dwell time of the one shot pulse, at which time the series of digital pulses will be terminated.

Referring to FIG. 5, a timing diagram for the signals in the circuit of FIG. 2 is shown. At time $t_1$ the power signal of $+V_2$ is applied. The levels of the signals prior to $t_1$ are not considered here as they do not affect the function of the disclosed device. Power signal 33 assumes a value of $+V_2$ and maintains that value as long as the transducer is energized. The input to gating circuit 19 is represented by 34 which is the charging characteristic of capacitor C1 through resistor R1. First NOR gate 23 having two logical low input states provides a logical high output 36 immediately after time $t_1$. The high input state 36 from first NOR gate 23 is connected to both inputs of NOR gate 24 providing a low output state 37 therefrom. It may be seen that the period $T_2$ is determined by the values of R1 and C1 which govern the time required for gating circuit input 34 to reach transfer voltage V1.

The low state output 37 from second NOR gate 24 and gating circuit 19 is connected to one input of first NOR gate 26 in astable multi-vibrator 21. Assuming the second input to first NOR gate 26 is a high state the output therefrom is a logical low. The logical low from NOR gate 26 is connected to both inputs of second NOR gate 27 and astable multi-vibrator 21 produces a logical high output therefrom as seen at 38 in FIG. 5. The second input to first NOR gate 26 therefore falls to a low state through resistor R2 and capacitor C2 providing a high state at the output of NOR gate 26 which is in turn connected to the input of NOR gate 27 for causing the astable multi-vibrator 21 output to assume a low state as seen at 39. This places the second input to NOR gate 26 in a logical high state and an oscillatory output 41 seen as a series of digital pulses results during the time period T2. The period of oscillation for signal 41 is T4 and is governed by the choice of resistor R2 and capacitor C2.

The output 41, comprising a series of digital pulses from astable multi-vibrator 21, is connected to the input of AC coupling circuit 22 and is passed by capacitor C3 through the series connected resistor R3 to the one input terminal of torquer control 17 appearing there as signal 42 in FIG. 5. It may be seen that signal 42 from AC coupling circuit 22 is substantially in phase with signal 41 from astable multi-vibrator 21. Coupling circuit 22, as seen in FIG. 2, has the series connection of capacitor C3 and R3. C3 and R3, along with the input circuit constants of torquer control 17, should have an RC time constant much greater than the oscillator period $T_4$. This RC time constant should also be much less than the total dither time period $T_2$. If these conditions are met, the unipolar oscillator pulses 41 are quickly converted to bipolar dither pulses 42. $T_3$ represents this conversion period or stabilization time. The moving member in the pick-off 13 responds to the urging of torquer 16 due to the input to torquer control 17 during the period $T_2$. The amplitude of signal 42 is established by the level of $+V_2$ and the value of resistor R3 in coupling circuit 22 along with the input impedance of torquer control 17. Signal 42 is responsible for removal of static friction in the mechanical mounts for the moving member in pick-off 13. Oscillator output from coupling circuit 22 ceases at the end of period T2 as explained above. Coupling circuit 22 therefore passes the series of digital pulses but blocks low frequency or DC signals and therefore prevents the digital oscillator from affecting the transducer signal introduced at terminal 28 during normal operation of the transducer.

It should be noted that other means for AC coupling and DC isolation of astable multi-vibrator 21 from torquer control 17 are envisioned. For example, oscillatory output 41 could be transformer coupled to the one input of torquer control 17. AC coupling and DC isolation may also be obtained mechanically, with the attendant forementioned disadvantages, through the use of a mechanical buzzer attached to the structure containing the supports for the movable member in pick-off 13.

Circuitry has been disclosed for providing a series of digital pulses for a given period of time after application of power for use in a dither circuit for removing static friction in a mechanical assembly. The circuit disclosed has a small number of components and standby power is very low, being in the microwatt range. Moreover, power used by the disclosed circuit is at a low level when the circuit is in operation and is determined primarily by the value of resistor R3 in coupling circuit 22 and the loading effect of torquer control 17. CMOS circuitry is desirable for constructing this circuit as it has near zero off power drain. The only off power requirements result from leakage currents.

What is claimed is:

1. A digital oscillator responsive to application of a DC power signal for exciting an electrical device, comprising a gating circuit coupled to receive the DC power signal and providing an output responsive thereto, means coupled to said gating circuit for changing the output therefrom at the end of a predetermined time period after application of the DC power signal, an astable multi-vibrator for receiving the output from said gating circuit, said astable multi-vibrator providing a series of unipolar signal pulses during said predetermined time period, and means for converting said series of unipolar signal pulses to a series of bipolar signal pulses and for coupling said series of bipolar signal pulses to the electrical device, whereby the electrical device is driven bidirectionally by said bipolar signal pulses during said predetermined time period.

2. A digital oscillator as in claim 1 wherein said gating circuit comprises first and second "NOT" gates connected in series and said means for changing comprises a resistance-capacitance network for providing an exponentially increasing output connected to said first "NOT" gate, said first "NOT" gate receiving said resistance-capacitance network output and producing a first high logic output until said capacitance charges for said predetermined time period, said second "NOT" gate providing a second high logic output after said predetermined time period, said astable multi-vibrator being configured to terminate said series of signal pulses upon receipt of said second high logic output.

3. A digital oscillator as in claim 1 wherein said means for changing the output from said gating circuit comprises a resistive-capacitive circuit connected to the input of said gating circuit so that when said DC power signal is applied, the input to said gating circuit increases exponentially to a value which causes the gating circuit output to change state at the end of said predetermined time period.

4. A digital oscillator as in claim 1 wherein said means for coupling comprises a series resistive-capacitive circuit connected between said multi-vibrator and said electric device, whereby said electric device is AC coupled and DC is isolated from said multi-vibrator, said series resistive capacitive circuit having a characteristic time which is much longer than the period of said unipolar signal pulses and much shorter than said predetermined time period.

5. A digital oscillator responsive to application of a DC power signal, comprising a gating circuit coupled to receive the DC power signal and providing an output responsive thereto, means coupled to said gating circuit for delaying the output from said gating circuit, whereby said output responsive to the DC power signal changes state at the end of a predetermined time period, and astable multi-vibrator for receiving said output responsive to the DC power signal and providing a series of unipolar output signal pulses, said series of unipolar output signal pulses being terminated by the change in state of the gating circuit output, and a coupling circuit converting said series of unipolar output signal pulses to a series of bipolar output signal pulses and providing said series of bipolar output signal pulses at a digital oscillator output, said digital oscillator output being AC coupled and DC isolated from said multi-vibrator.

6. A digital pulse generator comprising an astable multi-vibrator for providing a series of signal pulses having a predetermined oscillation period, a gating circuit for actuating said astable multi-vibrator for a predetermined time period, and a coupling circuit connected to said astable multi-vibrator and having an output terminal for presenting said series of signal pulses, said coupling circuit having a characteristic time which is much less than said predetermined time period and much more than said predetermined oscillation period and providing isolation between said output terminal and said multi-vibrator for steady state signals.

7. In combination with a force balance transducer for connection to a source of electrical power and for measuring a physical quantity, said transducer having a pick-off device for providing an output signal, said pick-off device including a moving member and a stationary member, means for supporting said moving member providing for bidirectional motion relative to said stationary member, and a force producing device for receiving said output signal and for driving said moving member to a predetermined position relative to said stationary member, an astable multi-vibrator for providing a series of unipolar signal pulses, a gating circuit connected to the source of electrical power for actuating said astable multi-vibrator at the time of connection of the transducer to the source of electrical power, said gating circuit operating to terminate said series of unipolar signal pulses a given period of time after actuating said astable multi-vibrator, and means for converting said unipolar signal pulses to bipolar signal pulses and for coupling said series of bipolar signal pulses to said force producing device, whereby said moving member is driven bidirectionally in an oscillatory manner when the transducer is connected to the source of electrical power and for said given period of time thereafter, so that initial static friction levels in said means for supporting are overcome during said given period of time and said output is substantially free of errors induced by static friction thereafter.

8. A combination as in claim 7 wherein said means for coupling is a series resistive-capacitve circuit for providing high frequency coupling and low frequency isolation between said astable multi-vibrator and said torque producing device, said series resistive-capacitive circuit having a characteristic time which is less than said given period of time and greater than the period of said astable multi-vibrator.

9. A combination as in claim 7 wherein said gating circuit comprises a logic circuit element with two input terminals and an output terminal, said logic circuit element producing a high or low state output depending on the signals on said input terminals, a resistive-capacitive circuit connected to the input of said logic circuit element, whereby the signal state on said output terminal changes dependent upon the characteristic time of said resistive-capacitive circuit.

10. A combination as in claim 7 wherein said gating circuit comprises a one-shot signal device producing a signal output having a dwell time equivalent to said given period of time.

* * * * *